United States Patent
Wu et al.

(10) Patent No.: US 9,711,217 B1
(45) Date of Patent: Jul. 18, 2017

(54) MEMORY DEVICE AND OPERATING METHOD FOR RESISTIVE MEMORY CELL

(71) Applicant: MACRONIX INTERNATIONAL CO., LTD., Hsinchu (TW)

(72) Inventors: Chao-I Wu, Hsinchu (TW); Dai-Ying Lee, Hsinchu (TW); Ming-Hsiu Lee, Hsinchu (TW); Tien-Yen Wang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/134,438

(22) Filed: Apr. 21, 2016

Related U.S. Application Data

(60) Provisional application No. 62/280,713, filed on Jan. 20, 2016.

(51) Int. Cl.
*G11C 11/00* (2006.01)
*G11C 13/00* (2006.01)
*H01L 45/00* (2006.01)

(52) U.S. Cl.
CPC ...... *G11C 13/0069* (2013.01); *G11C 13/0064* (2013.01); *H01L 45/1233* (2013.01); *H01L 45/1253* (2013.01); *G11C 2013/0066* (2013.01)

(58) Field of Classification Search
CPC ............ G11C 13/0069; G11C 13/0064; H01L 45/1253; H01L 45/1233
USPC ....................................................... 365/148
See application file for complete search history.

(56) References Cited

U.S. PATENT DOCUMENTS

| | | | | |
|---|---|---|---|---|
| 752,985 | A * | 2/1904 | Koehler | A63D 5/10 48/16 |
| 6,984,859 | B2 * | 1/2006 | Ashida | G11C 11/412 257/208 |
| 7,732,800 | B2 * | 6/2010 | Lai | H01L 27/2436 257/4 |
| 7,989,251 | B2 * | 8/2011 | Nejad | H01L 45/06 438/57 |
| 8,153,485 | B2 * | 4/2012 | Lai | G11C 11/5664 257/2 |
| 8,154,070 | B2 * | 4/2012 | Mizukoshi | H01L 21/28282 257/314 |

(Continued)

OTHER PUBLICATIONS

Kim, et al.: "Low Power Operating Bipolar TMO ReRAM for Sub 10 nm Era"; 978-1-4244-7419-6/10/$26.00 ©2010 IEEE; pp. 19.3.1-19.3.4.

(Continued)

*Primary Examiner* — Viet Q Nguyen
(74) *Attorney, Agent, or Firm* — McClure, Qualey & Rodack, LLP

(57) ABSTRACT

A memory device and an operating method for a resistive memory cell are provided. The memory device includes the resistive memory cell. The resistive memory cell includes a first electrode, a second electrode and a memory film between the first electrode and the second electrode. The first electrode includes a bottom electrode portion and a sidewall electrode portion extending upwardly from the bottom electrode portion and between the memory film and the bottom electrode portion. A width of the sidewall electrode portion and a width of the memory film are smaller than a width of the bottom electrode portion.

14 Claims, 10 Drawing Sheets

(56) References Cited

U.S. PATENT DOCUMENTS

| | | | | |
|---|---|---|---|---|
| 8,729,521 B2 * | 5/2014 | Lung | .................... | H01L 27/2454 257/2 |
| 8,785,213 B2 * | 7/2014 | Oh | .......................... | H01L 45/04 257/E45.004 |
| 8,790,976 B2 * | 7/2014 | Oh | ...................... | H01L 27/2463 257/E21.004 |
| 8,822,969 B2 * | 9/2014 | Hwang | ................. | H01L 45/126 257/4 |
| 8,841,643 B2 * | 9/2014 | Oh | .......................... | H01L 45/04 257/3 |
| 8,884,263 B2 * | 11/2014 | Oh | ...................... | H01L 27/2409 257/4 |
| 2007/0278529 A1 * | 12/2007 | Lai | ...................... | H01L 27/2436 257/209 |
| 2008/0096341 A1 * | 4/2008 | Lai | ...................... | G11C 11/5678 438/210 |
| 2008/0170427 A1 * | 7/2008 | Choi | ................... | H01L 45/1226 365/148 |
| 2008/0283815 A1 * | 11/2008 | Nejad | ...................... | H01L 45/06 257/4 |
| 2009/0096568 A1 * | 4/2009 | Hosoi | ................... | H01L 27/101 338/20 |
| 2011/0012084 A1 * | 1/2011 | Lai | .......................... | H01L 45/04 257/5 |
| 2011/0220858 A1 * | 9/2011 | Hwang | ................... | H01L 27/24 257/1 |
| 2011/0278528 A1 * | 11/2011 | Lung | ................... | H01L 27/2454 257/2 |
| 2012/0040508 A1 * | 2/2012 | Oh | ...................... | H01L 27/2463 438/382 |
| 2012/0119181 A1 * | 5/2012 | Oh | .......................... | H01L 45/04 257/4 |
| 2012/0225533 A1 * | 9/2012 | Kim | ...................... | H01L 27/224 438/382 |
| 2012/0294065 A1 * | 11/2012 | Hong | ...................... | H01L 45/04 365/148 |
| 2013/0270507 A1 * | 10/2013 | Park | .................... | H01L 45/1253 257/4 |

OTHER PUBLICATIONS

Wong, et al.: "Metal—Oxide RRAM"; vol. 0018-9219/$31.00 ©2012 IEEE 100, No. 6, Jun. 2012 | Proceedings of the IEEE; pp. 1951-1970.

Lin, et al.: "Excellent Resistance Variability Control of WOx ReRAM by a Smart Writing Algorithm"; Department of Electronics Engineering and Institute of Electronics; pp. 1-2.

Balatti, et al.: "Understanding pulsed-cycling variability and endurance in HfOx RRAM"; 978-1-4673-7362-3/15/$31.00©2015 IEEE; pp. 5B.3.1-5B.3.6.

Ninomiya, et al.: "Conductive Filament Scaling of TaOx Bipolar ReRAM for Long Retention with Low Current Operation"; 978-1-4673-0847-2/12/$31.00 ©2012 IEEE 2012 Symposium on VLSI Technology Digest of Technical Papers; pp. 73-74.

Hsu, et al.: "A Study of Array Resistance Distribution and a Novel Operation Algorithm for WOx ReRAM Memory"; Extended Abstracts of the 2015 International Conference on Solid State Devices and Materials, Sapporo, 2015, pp. 1168-1169.

\* cited by examiner

MEMORY DEVICE AND OPERATING METHOD FOR RESISTIVE MEMORY CELL

This application claims the benefit of U.S. provisional application Ser. No. 62/280,713, filed Jan. 20, 2016, the subject matter of which is incorporated herein by reference.

BACKGROUND

Technical Field

The disclosure relates to a memory cell and an operating method for the same, and particularly to a resistive memory cell and an operating method for the same.

Description of the Related Art

Along with the advance in semi-conductor technology, electronic elements are kept being miniaturized, such that electronic products possess more and more functions when the size remains unchanged or become even smaller. As there are more and more information to be processed, the demand for the memory having larger capacity but smaller size is ever increasing.

Electric currently, the read-write memory stores data by means of a transistor structure assisted by a memory cell. However, the technology for manufacturing such memory has come to a bottleneck in terms of scalability. Therefore, more advanced memory structures, such as phase change random access memory (PCRAM), magnetic random access memory (MRAM), and resistive random access memory (RRAM), are presented. The RRAM, having the advantages of fast read-write speed, non-destructive access, tolerance against extreme temperatures and compatibility with electric current manufacturing process of complementary metal oxide semiconductor (CMOS), is a new memory technology with great potential to replace the electric current storage media.

SUMMARY

The present disclosure provides a memory device and an operating method for a resistive memory cell.

According to an embodiment, a memory device includes the resistive memory cell. The resistive memory cell includes a first electrode, a second electrode and a memory film between the first electrode and the second electrode. The first electrode includes a bottom electrode portion and a sidewall electrode portion extending upwardly from the bottom electrode portion and between the memory film and the bottom electrode portion. A width of the sidewall electrode portion and a width of the memory film are smaller than a width of the bottom electrode portion.

According to another embodiment, a memory device comprises a resistive memory cell comprising a first electrode, a second electrode and a memory film between the first electrode and the second electrode. The first electrode comprises a titanium nitride. The memory film comprises a titanium oxynitride. The second electrode comprises a titanium nitride.

According to yet another embodiment, a method for operating a resistive memory cell comprises the following steps. A writing step comprises writing the resistive memory cell with a pulse of a first width or shots of a first number of times. After the writing step, it is verified if the resistive memory cell reaches a predetermined resistance or electric current. It is verified if the first width or the first number of times reaches a maximum width or a maximum number of times, if the resistive memory cell does not reach the predetermined resistance or electric current. The resistive memory cell is written with a pulse of a second width or shots of a second number of times, if the first width or the first number of times does not reach the maximum width or the maximum number of times. The second number of times is bigger than the first number of times. The second width is bigger than the first width.

The above and other embodiments of the disclosure will become better understood with regard to the following detailed description of the non-limiting embodiment(s). The following description is made with reference to the accompanying drawings.

DETAILED DESCRIPTION

The present disclosure provides a memory device and a method for operating a resistive memory cell. The resistive memory cell can have a large and stable switching window, and good reliability.

The illustrations may not be necessarily be drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments.

According to embodiments, the resistive memory cell comprises a first electrode, a second electrode and a memory film between the first electrode and the second electrode. A material film may be between the memory film and the second electrode. In embodiments, the resistive memory cell can reach excellent electrical characteristic through designs of materials and structures.

Figure 1:
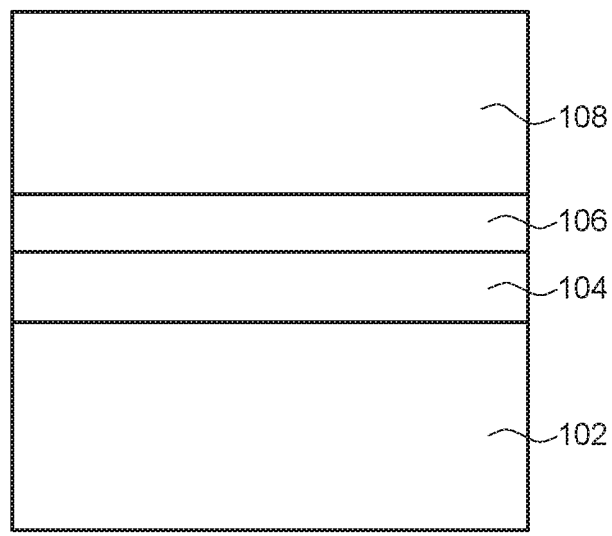
FIG. 1 illustrates a cross-section view of a resistive memory cell according to an embodiment.

FIG. 1 illustrates a cross-section view of the resistive memory cell according to an embodiment. The resistive memory cell comprises a first electrode 102, a memory film 104 on the first electrode 102, a material film 106 on the memory film 104, and a second electrode 108 on the material film 106.

In an embodiment, the material film 106 comprises compositions of a memory material. In embodiments, compositions for the memory film 104 and memory material for the material film 106 comprise a material having various resistance (high and low resistance states), changeable by adjusting a voltage bias applied the memory film 104 and memory material for the material film 106. Compositions of the memory film 104 may be different from the compositions of the material film 106. In an embodiment, for example, the resistive memory cell is a resistive random access memory (RRAM, ReRAM), of which the first electrode 102 comprises a titanium nitride (TiN), the memory film 104 comprises a titanium oxynitride (TiOxNy), the material film 106 comprises a titanium oxide (TiOx), the second electrode 108 comprises a titanium nitride. According to the material designs, the resistive memory cell can have a large switching window, and good reliability. For example, the memory retention can maintain longer than 3 hours at 250° C.

In another embodiment, the material film 106 comprises an electrode material. A material of the second electrode 108 may be different from a material of the material film 106. In an embodiment, for example, the resistive memory cell is a resistive random access memory, of which the first electrode 102 comprises a titanium nitride (TiN), the memory film 104 comprises a titanium oxynitride (TiOxNy), the material film 106 comprises a titanium (Ti), and the second electrode 108 comprises a titanium nitride. According to the material designs, the resistive memory cell can have a large switching window, and good reliability. For example, the memory retention can maintain longer than 3 hours at 250° C.

In some embodiments, the material film 106 of titanium oxide may be an oxidized film formed from the deposited titanium material film 106 exposed to the atmosphere air. In some embodiments, the material film 106 of titanium oxide is formed by performing an additional oxidation step to the titanium material film 106.

In present disclosure, materials of the resistive memory cell are not limited to the foregoing examples. In other embodiments, the first electrode 102, the second electrode 108 and the electrode material of the material film 106 may use suitable kinds of conductive materials, for example a metal or a metal nitride, comprising a transition metal or a transition metal, such as Ta, TaN, Hf, HfN, etc. In various embodiments, the memory film 104 and the memory material of the material film 106 may use suitable kinds of memory materials, for example a metal oxide or a metal oxynitride for a resistive memory material. For example, the metal oxide may comprise a transition metal containing oxide such as TaOx, HfOx, etc. For example, the metal oxynitride may comprise a transition metal containing oxynitride, such as TaOxNy, HfOxNy, etc.

Figure 2A:
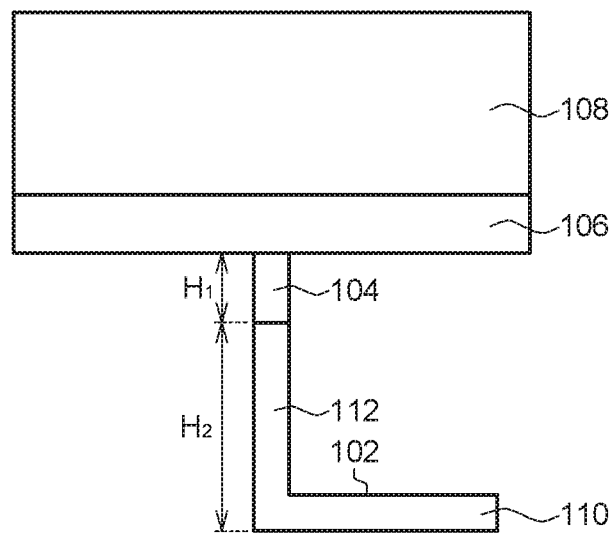
FIG. 2A illustrates a cross-section view of a resistive memory cell according to an embodiment.
Figure 2B:
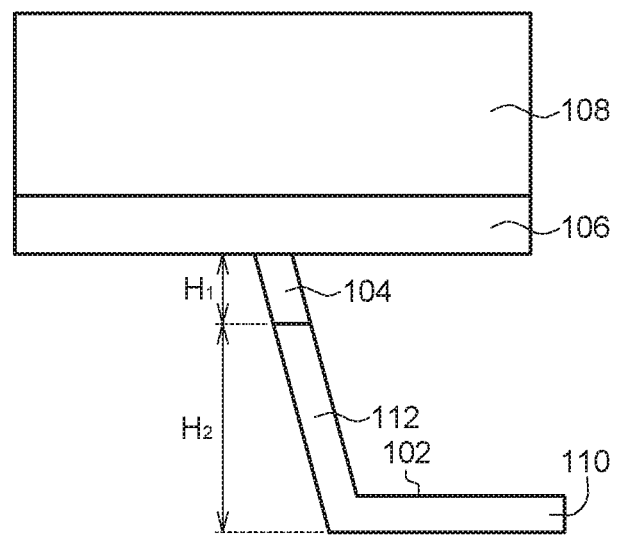
FIG. 2B illustrates a cross-section view of a resistive memory cell according to an embodiment.

FIG. 2A and FIG. 2B illustrate cross-section views of the resistive memory cells according to other embodiments. The resistive memory cells of FIG. 2A and FIG. 2B are different from the resistive memory cell of FIG. 1 in the following illustrating. The first electrode 102 comprises a bottom electrode portion 110 and a sidewall electrode portion 112 extending upwardly from the bottom electrode portion 110. The sidewall electrode portion 112 is between the memory film 104 and the bottom electrode portion 110. A width of the sidewall electrode portion 112 and a width of the memory film 104 are smaller than a width of the bottom electrode portion 110, and may be smaller than a width of the material film 106 and a width of the second electrode 108. The sidewall electrode portion 112 and the memory film 104 may have the same width substantially. The material film 106 and the second electrode 108 may have the same width substantially. In embodiments, a height H1 of the memory film 104 is smaller than a height H2 of the first electrode 102. For example, 0<H1/H2<0.1. The first electrode 102 and the memory film 104 may form a L shape. In embodiments, the bottom electrode portion 110 and the sidewall electrode portion 112 of the first electrode 102, forming an L shape, have an included angle of 45 degrees to 90 degrees.

FIG. 3 to FIG. 13 illustrate a process flow for manufacturing the memory device according to some embodiments.

Figure 3:
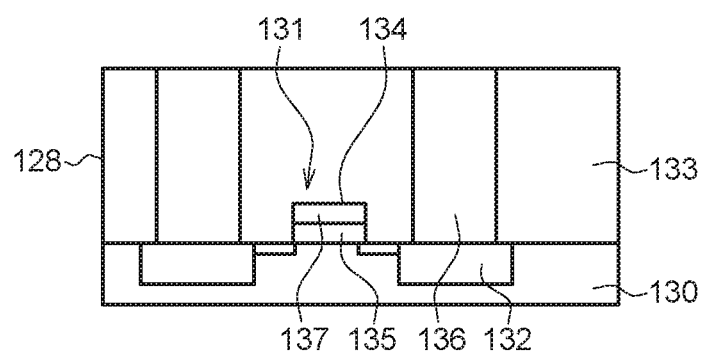
FIG. 3 to FIG. 13 illustrate a process flow for manufacturing a memory device according to some embodiments.

Referring to FIG. 3, a substrate structure 128 is provided, comprising a semiconductor substrate 130, and a transistor 131, a dielectric layer 133 and a conductive layer 136 formed on the semiconductor substrate 130. The semiconductor substrate 130 may comprise silicon, or other suitable semiconductor materials. The transistor 131 comprises a source/drain 132 and a gate structure 134. The source/drain 132 may comprise a heavily-doped region formed by doping the semiconductor substrate 130, such as an N+ region. The gate structure 134 may comprise a gate dielectric layer 135 and a gate electrode layer 137 on the gate dielectric layer 135. The gate dielectric layer 135 may comprise an oxide such as silicon oxide, or other suitable dielectric materials. The gate electrode layer 137 may comprise polysilicon, or other suitable conductive materials.

The conductive layer 136 passing through the dielectric layer 133 may comprise a metal plug, electrically connected to the source/drain 132. The dielectric layer 133 may comprise an oxide, a nitride, an oxynitride, such as silicon oxide, silicon nitride, silicon oxynitride, or other suitable dielectric materials. The conductive layer 136 may comprise a metal, such as W, or other suitable conductive materials. In an embodiment, the substrate structure 128 shown in FIG. 3 may be a flatted structure through a chemical mechanical polishing (CMP) process.

Figure 4:
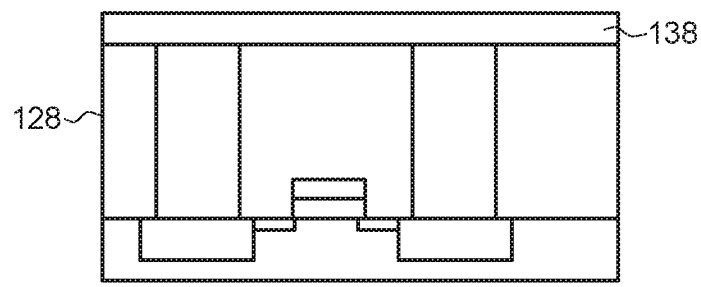

Referring to FIG. 4, a hard mask layer 138 is formed on the substrate structure 128. In an embodiment, the hard mask layer 138 comprises SiN. In other embodiments, the hard mask layer 138 may use other suitable materials. In an embodiment, for example, the hard mask layer 138 may have a thickness of 1000 Å to 2000 Å, such as 1500 Å.

Figure 5A:
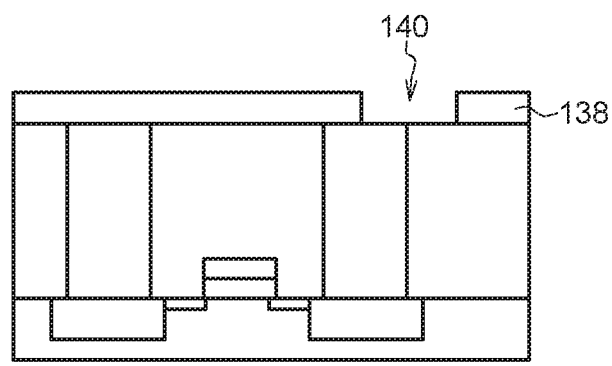
Figure 5B:
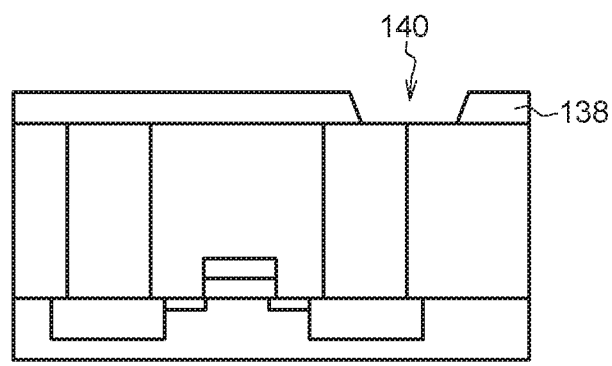

Referring to FIG. 5A, the hard mask layer 138 is patterned to form an opening 140 therein. An included angle of the opening 140 is not limited to 90 degrees as shown in FIG. 5A. In other embodiments, the included angle of the opening 140 may be bigger than 90 degrees as shown in FIG. 5B.

Figure 6:
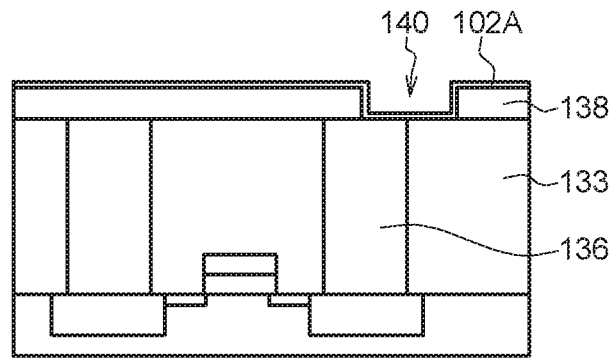

Referring to FIG. 6, a first electrode 102A is formed on an upper surface of the hard mask layer 138, and on a sidewall of the hard mask layer 138 and upper surfaces of the dielectric layer 133 and the conductive layer 136 exposed by the opening 140. In an embodiment, for example, the first electrode 102A may have a thickness of 50 Å to 200 Å, such as 100 Å.

Figure 7:
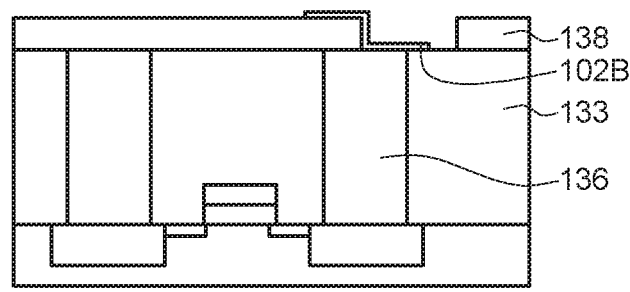

Referring to FIG. 7, the first electrode 102A is patterned to remain a first electrode 102E having a stair shape covering the conductive layer 136 and portions of the hard mask layer 138 and the dielectric layer 133 adjacent to the conductive layer 136, and to expose a portion of the dielectric layer 133 and a portion of the hard mask layer 138 adjacent to the dielectric layer 133.

Figure 8:
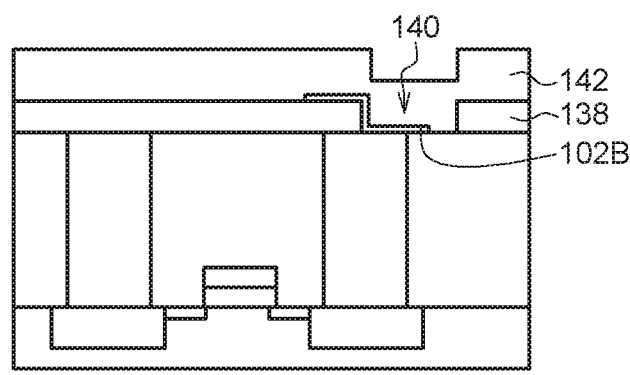

Referring to FIG. 8, a sacrificial layer 142 is formed on the hard mask layer 138 and the first electrode 102B, and in the opening 140. In an embodiment, the sacrificial layer 142 may comprise an oxide, such as a deposited TEOS. In other embodiments, the sacrificial layer 142 may use other suitable materials.

Figure 9:
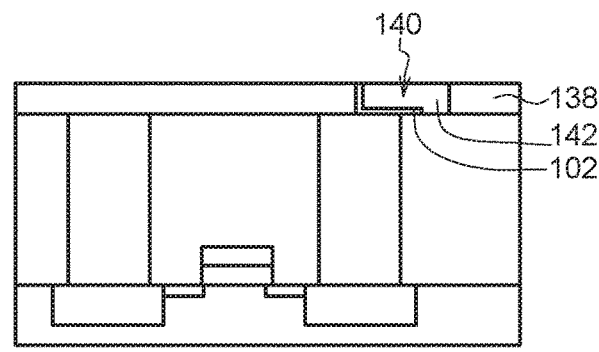

Referring to FIG. 9, upper portions of the sacrificial layer 142 and the first electrode 102B are removed to remain the sacrificial layer 142 and the first electrode 102 having an L shape in the opening 140. In an embodiment, the removing step may use a CMP method that may stop on the hard mask layer 138.

Figure 10:
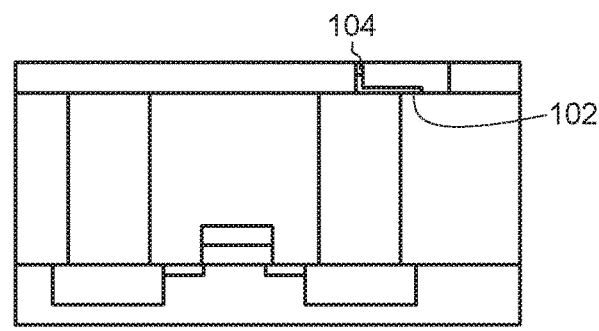

Referring to FIG. 10, an exposed upper portion of the first electrode 102 is oxidized to form the memory film 104 of an oxide. The height (H1 in FIG. 2A, FIG. 2B) of the memory film 104 may be controlled by an oxidation process. The oxidation comprises a chemical vapor deposition (CVD) method or a physical vapor deposition (PVD) method. In an embodiment, for example, the first electrode 102 comprises titanium nitride (TiN), and the memory film 104 comprises titanium oxynitride (TiOxNy) formed through the oxidation step.

Figure 11:
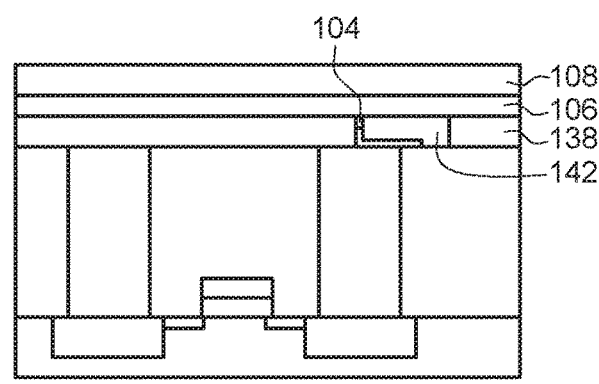

Referring to FIG. 11, the material film 106 is formed on the memory film 104, the sacrificial layer 142 and the hard mask layer 138. In an embodiment, the material film 106 may have a thickness of 5 Å to 50 Å, such as 10 Å. The second electrode 108 is formed on the material film 106. In an embodiment, the second electrode 108 may have a thickness of 50 Å to 500 Å, such as 400 Å.

Figure 12A:
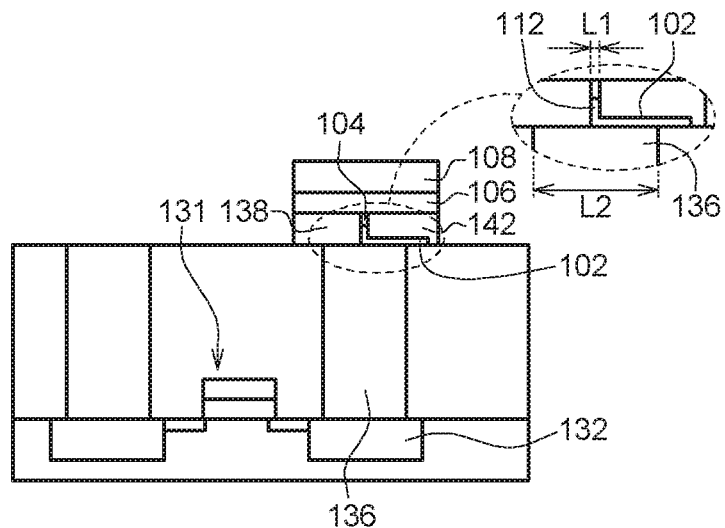

Referring to FIG. 12A, the sacrificial layer 142, the hard mask layer 138, the material film 106 and the second electrode 108 are patterned.

Figure 12B:
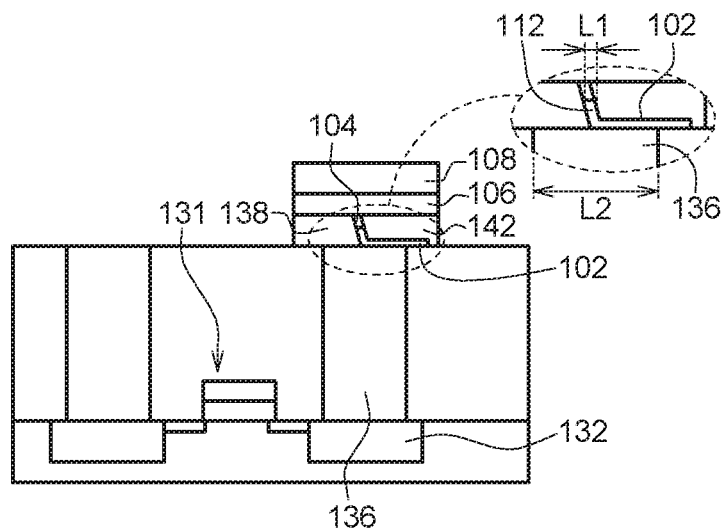

Referring to FIG. 12A and FIG. 12B, the first electrode 102 of the resistive memory cell is electrically connected to the source/drain 132, for example the drain, of the transistor 131 through the conductive layer 136. In an embodiment, for example, widths of the patterned material film 106 and second electrode 108 are 5000 Å. In embodiments, a width L1 of the sidewall electrode portion 112 of the first electrode 102 is smaller than a width L2 of the conductive layer 136. For example, 0<L1/L2<0.5. In an embodiment, for example, the width L1 of the sidewall electrode portion 112 is 10 Å to 200 Å, such as 100 Å. The width L2 of the conductive layer 136 is 1000 Å to 5000 Å, such as 3000 Å.

Figure 13:
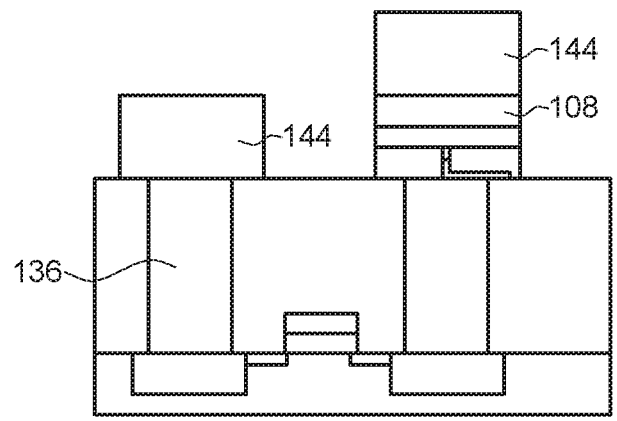

Referring to FIG. 13, a conductive layer 144 is formed on the conductive layer 136 and the second electrode 108. The conductive layer 144 may comprise a metal (such as M1) routing.

Figure 14:
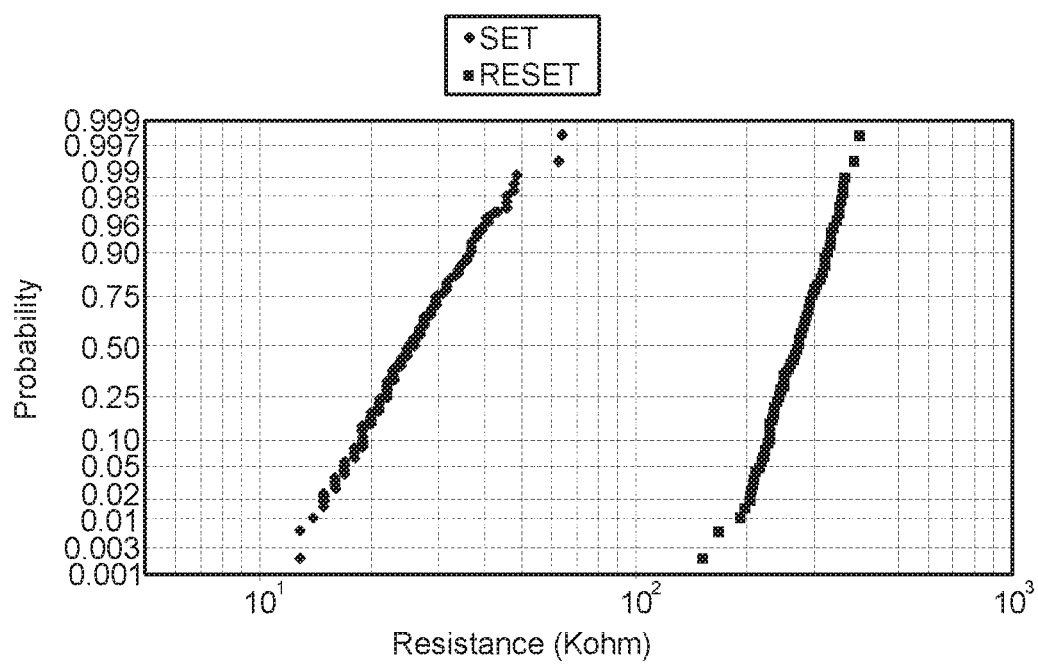
FIG. 14 shows a relation of a resistance and a probability of the resistive memory cell in a set state and in a reset state according to an embodiment.

FIG. 14 shows a relation of a resistance and a probability of the resistive memory cell in a set state and in a reset state according to an embodiment. It is shown that the resistive memory cell has a large switching window, i.e. a large resistance gap, and thus the set state and the reset state of the resistive memory cell can be recognized easily.

Figure 15:
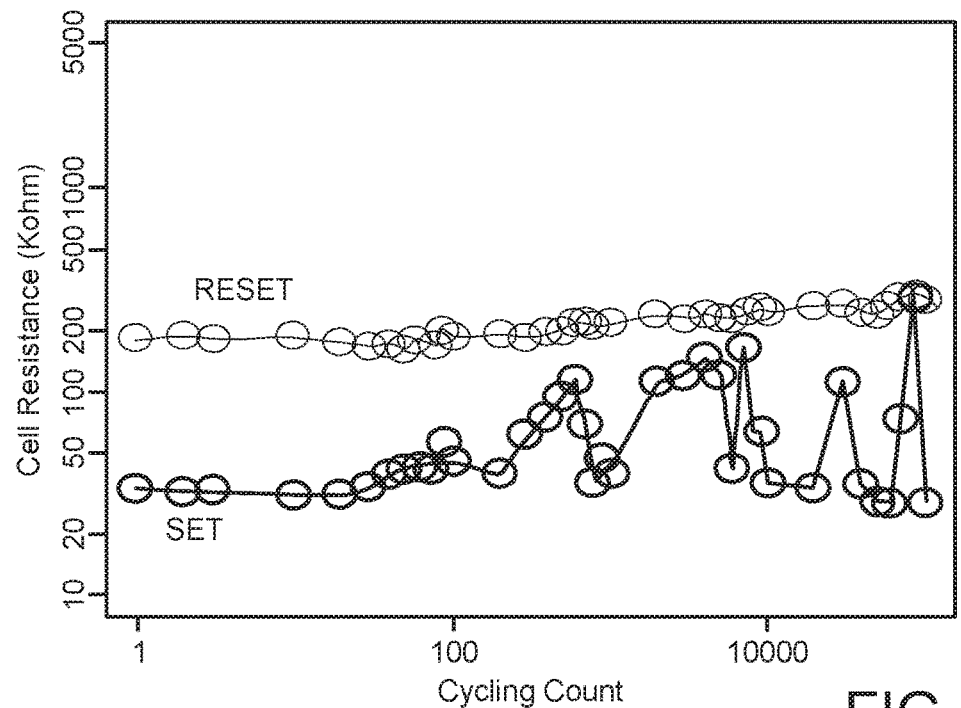
FIG. 15 shows a relation of a cycling count and a cell resistance of a resistive memory cell in a set state and in a reset state.
Figure 16:
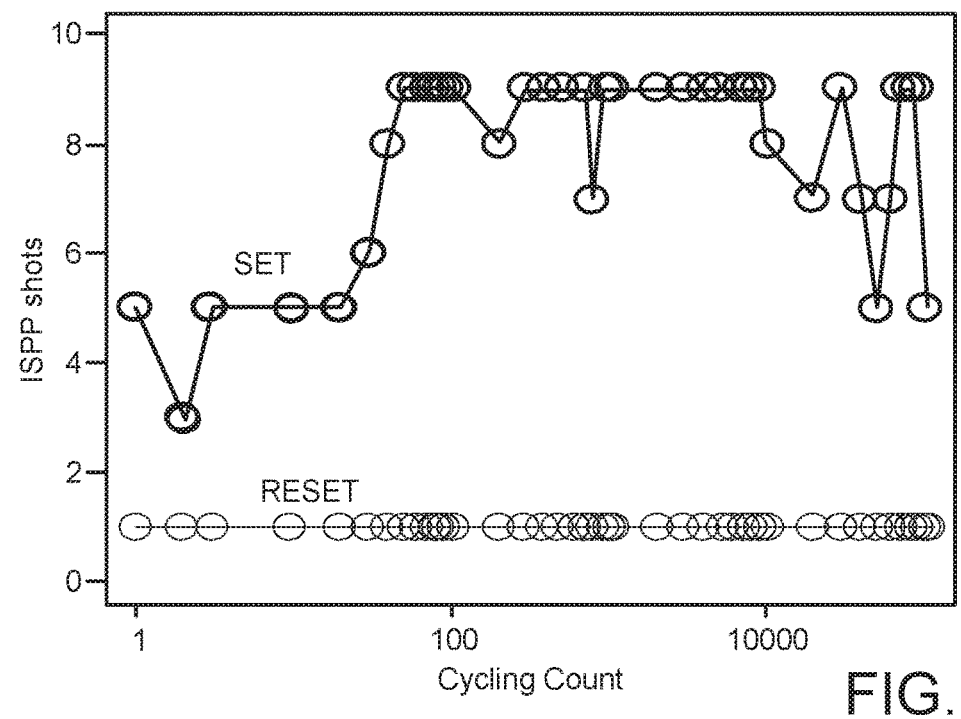
FIG. 16 shows a result of an incremental step pulse programming (ISPP) method for a resistive memory cell.
Figure 17:
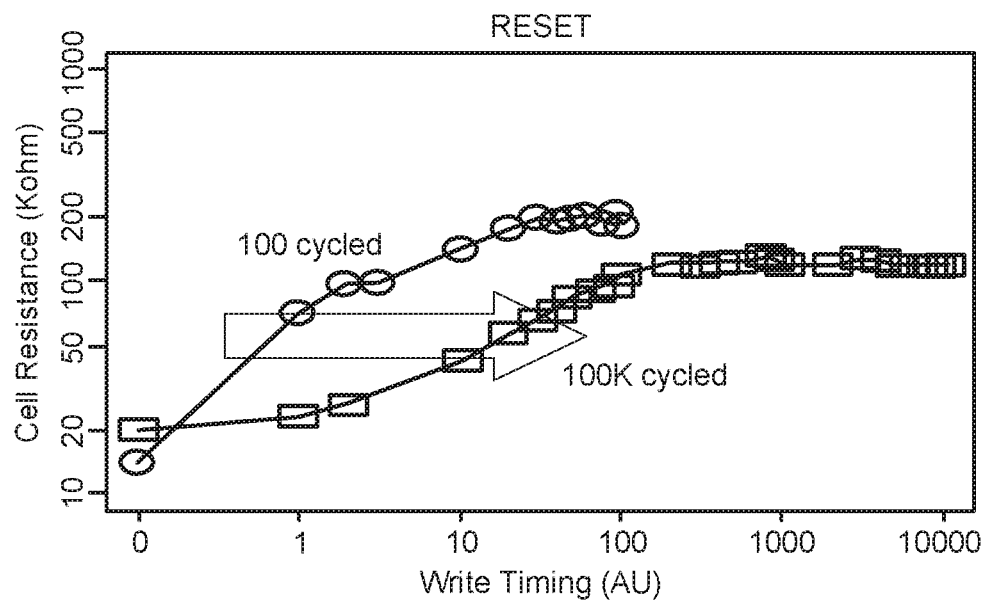
FIG. 17 shows characteristics of writing timing and resistance of a resistive memory cell in a reset state.
Figure 18:
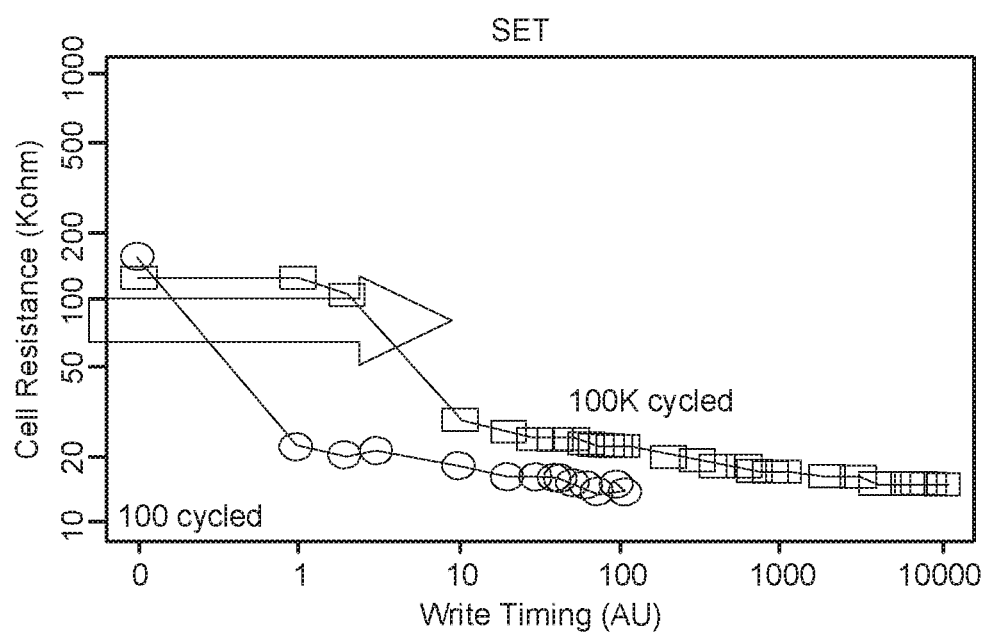
FIG. 18 shows characteristics of writing timing and resistance of a resistive memory cell in a set state.

In the present disclosure, the inventors find that after cycling operating, a resistive memory cell (not limited to the resistive memory cell structure disclosed herein) would have a resistance switching window instability problem (as shown in FIG. 15), which would result in switching fail and reliability degrading. In addition, it is hard to monitor the failure cells during the operating, and the problem can be solved by a conventional incremental step pulse programming (ISPP) method (as shown in FIG. 16). The inventors develops a method for operating a memory device according to the discovered characteristics of write timing and resistance (in the reset state as shown in FIG. 17, and in the set state as shown in FIG. 18), which may be used for monitoring degradation behavior of the operated resistive memory cell.

The following disclose the operating method for a memory device according to embodiments, which may be used for monitoring degradation behavior or healthy status for the resistive memory cell. The operating method comprises an algorithm with degradation awareness scheme, which can improve the reliability of the resistive memory cell.

Figure 19:
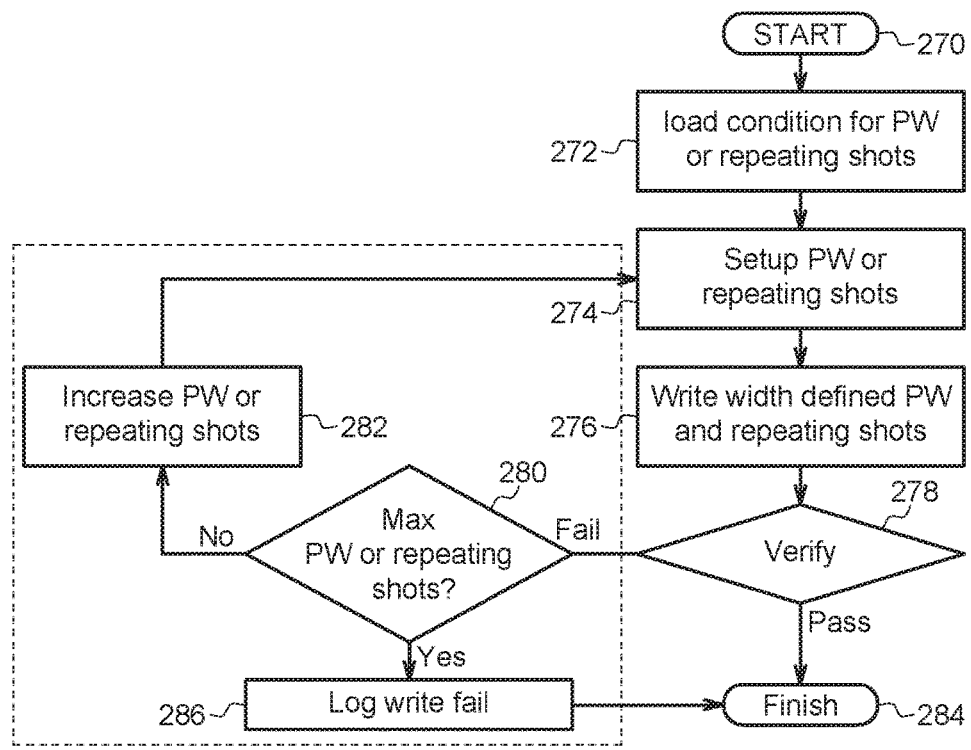
FIG. 19 illustrates an operating method for a resistive memory cell according to an embodiment.

FIG. 19 illustrates the operating method for the resistive memory cell in an array of memory cells according to an embodiment. The method starts in a step 270. In a step 272, a condition for writing the resistive memory cell is loaded.

In a step 274, a setting up step is performed, comprising setting up a width of a pulse or a number of times of shots for writing the resistive memory cell. In an embodiment, the width of the pulse or the number of times of the shots is set to a first width or a first number of times. For example, the number N of times of the shots means there are N writing pulses.

In a step 276, a writing step is performed, comprising writing the resistive memory cell with the pulse of the first width or the shots of the first number of times, set in the step 274. In embodiments, during the writing step 276, no verifying step is performed. For example, no verifying step is performed between the shots.

After the writing step 276, a step 278 is performed, which is a verifying step, comprising verifying if the written resistive memory cell reaches a predetermined resistance or electric current. The method proceeds to a step 280, verifying the first width of the pulse or the first number of times of the shots reaches a maximum width or a maximum number of times, if the resistive memory cell does not reach the predetermined resistance or electric current. The method proceeds to a step 282: increasing the width of the writing pulse or the number of times of the writing shots, i.e. increasing the width from the first width to a second width of the writing pulse, or increasing the number of times from the first number of time to a second number of times of the writing shots, if in the step 280 it is verified that the maximum width or the maximum number of times is not reached. Then, the process as shown in FIG. 19 can be performed with the setting up step 274 performed with the second width or the second number of times obtained in the step 282. In an embodiment, an awareness scheme as indicated by a dotted line involving the step 280 and the step 282 may be used to motor the degradation condition for the resistive memory cell.

In the step 278, if the resistive memory cell is verified to reach the predetermined resistance or electric current, the method proceeds to an end step 284. In addition, in the step 280 if it is verified that the maximum width or the maximum number of times is reached, the method proceeds to a step 286, logging the writing fail, and then proceeds to the end step 284.

Figure 20:
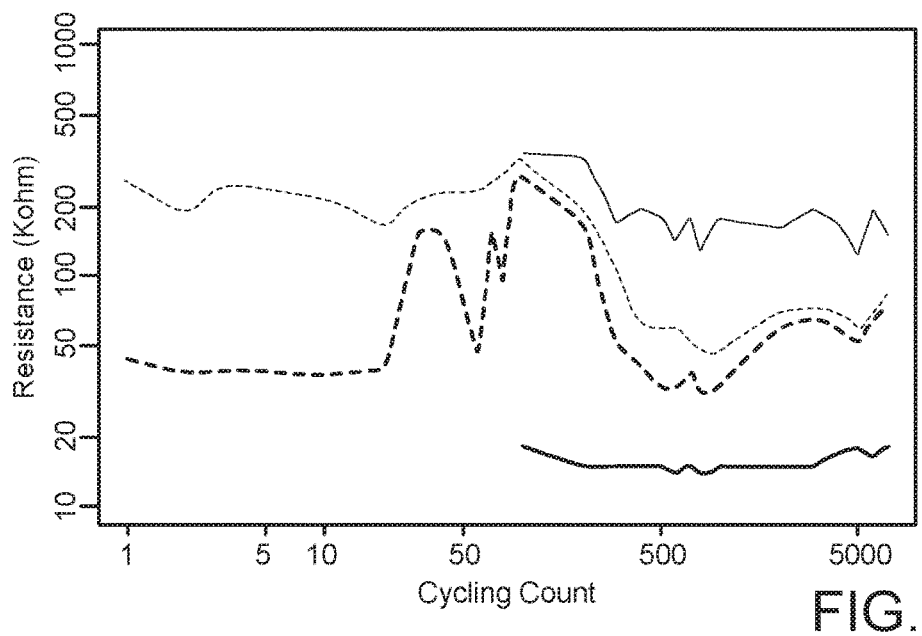
FIG. 20 shows results of operating a resistive memory cell in an embodiment and a comparative example.

FIG. 20 shows operating results of the resistive memory cells of embodiment (indicated with solid lines) and comparative examples (indicated with dotted lines). The operating method of embodiment comprises the awareness scheme comprising the steps 280 and 282 as shown in FIG. 19. The operating method of comparative omits the steps 280 and 282. As found in FIG. 20, by using the operating method according to embodiments, the resistive memory cell can maintain a stable resistance switching window after cycling operation.

According to embodiments, the resistive memory cell can have a large switching window and good reliability. In addition, using the operating method according to embodiments, the resistive memory cell can have a stable switching window.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a resistive memory cell comprising a first electrode, a second electrode and a memory film between the first electrode and the second electrode; and
a conductive layer, wherein
the first electrode comprises a bottom electrode portion and a sidewall electrode portion extending upwardly from the bottom electrode portion, and between the memory film and the bottom electrode portion,
a width of the sidewall electrode portion and a width of the memory film are smaller than a width of the bottom electrode portion,
the first electrode is on the conductive layer, a width L1 of the sidewall electrode portion is smaller than a width L2 of the conductive layer.

2. The memory device according to claim 1, wherein a height H1 of the memory film is smaller than a height H2 of the first electrode.

3. The memory device according to claim 2, wherein $0<H1/H2<0.1$.

4. The memory device according to claim 1, wherein $0<L1/L2<0.5$.

5. The memory device according to claim 1, wherein the width L1 of the sidewall electrode portion is 10 Å-200 Å, the width L2 of the conductive layer is 1000 Å-5000 Å.

6. The memory device according to claim 1, wherein the sidewall electrode portion and the memory film have the same width.

7. The memory device according to claim 1, further comprising a memory material on the memory film, wherein the memory film and the memory material have different materials.

8. The memory device according to claim 1, further comprising a memory material on the memory film, wherein a width of the memory material is bigger than the width of the memory film.

9. The memory device according to claim 1, further comprising an electrode material, wherein the electrode material is between the second electrode and the memory film and has a material different from a material of the second electrode.

10. The memory device according to claim 9, wherein the electrode material and the second electrode have the same width.

11. The memory device according to claim 1, wherein the bottom electrode portion and the sidewall electrode portion have an included angle therebetween, the included angle is 45-90 degrees.

12. The memory device according to claim 1, wherein the first electrode has a L shape.

13. The memory device according to claim 1, wherein the first electrode and the memory film form a L shape.

14. The memory device according to claim 1, further comprising a transistor, wherein the first electrode is electrically connected to a source/drain of the transistor through the conductive layer.

* * * * *